United States Patent [19]
Hunt et al.

[11] Patent Number: 5,362,977
[45] Date of Patent: Nov. 8, 1994

[54] SINGLE MIRROR LIGHT-EMITTING DIODES WITH ENHANCED INTENSITY

[75] Inventors: Neil E. J. Hunt, Scotch Plains; Erdmann F. Schubert, New Providence, both of N.J.

[73] Assignee: AT&T Bell Laboratories, Murray Hill, N.J.

[21] Appl. No.: 997,415

[22] Filed: Dec. 28, 1992

[51] Int. Cl.$^5$ .................. H01L 29/161; H01L 29/205; H01L 29/225; H01L 33/00
[52] U.S. Cl. ........................................ 257/98; 257/13; 257/94
[58] Field of Search ....................... 257/12, 13, 14, 15, 257/22, 94, 96, 97, 98

[56] References Cited

U.S. PATENT DOCUMENTS

| | | | |
|---|---|---|---|
| 4,644,378 | 2/1987 | Willians | 257/13 |
| 4,868,612 | 9/1989 | Oshima et al. | 257/14 |
| 5,027,164 | 6/1991 | Awano | 257/15 |
| 5,089,860 | 2/1992 | Deppet et al. | 357/16 |
| 5,229,627 | 7/1993 | Kosaka | 257/85 |

OTHER PUBLICATIONS

D. G. Deppe et al., Optically-Coupled Mirror-Quantum Well InGaAs-GaAs Light Emitting Diode, Electronics Letters, vol. 26, No. 20, Sep. 27, 1990, pp. 1665–1666.

Primary Examiner—Jerome Jackson, Jr.
Assistant Examiner—Nathan K. Kelley
Attorney, Agent, or Firm—Oleg E. Alber

[57] ABSTRACT

This invention embodies single mirror light-emitting diodes (LEDs) with enhanced intensity. The LEDs are Group III–V and/or II–IV compound semiconductor structures with a single metallic mirror. The enhanced intensity is obtained by placing an active region of the LED having from two to ten, preferably from four to eight, quantum wells at an anti-node of the optical node of the device created by a nearby metallic mirror. Such multiquantum well LED structures exhibit enhanced efficiencies approaching that of a perfect isotropic emitter.

16 Claims, 3 Drawing Sheets

SINGLE MIRROR LIGHT-EMITTING DIODES WITH ENHANCED INTENSITY

TECHNICAL FIELD

This invention concerns light-emitting diodes (LEDs) with optimized intensity of emission.

BACKGROUND OF THE INVENTION

Light Emitting Diodes (LEDs) are preferred over lasers for short distance fiber communications because of their greater reliability and lower cost, although the optical power coupled into a fiber is smaller. Since their emission is purely spontaneous, LEDs are less susceptible to power changes with temperature. Therefore, it is of interest to seek improvements in output intensity without resorting to a structure with optical gain.

By positioning an optical reflector behind a thick spontaneously emitting surface, the far field intensity of an LED could be doubled, compared to an LED without a mirror. For example, see T. Karo et al. "GaAs/GaAlAs Surface Emitting IR LED With Bragg Reflector Grown MOCVD", *Journal Crystal Growth*, 107, 1991, pp. 832-835. The normal incidence emission can also be enhanced by making the active region thin, and placing it in the anti-node of an optical mode. Deppe et al. demonstrated with a single quantum-well structure that the enhancement and inhibition of emission depends on the quantum well placement relative to a single reflective mirror. See D. G. Deppe et al., "Optically-Coupled Mirror Quantum Well InGaAs-GaAs Light-Emitting Diode", *Electronic Letters*, Vol. 27, 1990, pp. 1165-1166. Also see U.S. Pat. No. 5,089,860 issued Feb. 18, 1992, to Dennis G. Deppe et al. While Deppe et al., discussed the dependency of the normal incidence of emission on the position of the single quantum well structure relative to the single mirror, no quantitative consideration was given to the emission intensity of such single-mirror devices. Applicants have discovered that while the normal incidence of emission of a device with a single quantum well was enhanced due to the positioning of the quantum well in the anti-node of the optical mode of the LED, increase in an operating current beyond a certain limit led to the saturation of the emission intensity of such an LED.

SUMMARY OF THE INVENTION

This invention embodies single mirror light-emitting diodes (LEDs) with enhanced intensity. The LEDs are Group III-V and/or II-IV compound semiconductor structures with a single metallic mirror. The enhanced intensity is obtained by placing an active region of the LED having from two to ten, preferably from four to eight, quantum wells at an anti-node of the optical mode of the device created by a nearby metallic mirror. Such multiquantum well LED structures exhibit enhanced efficiencies approaching that of a perfect isotropic emitter.

DETAILED DESCRIPTION

Figure 1:
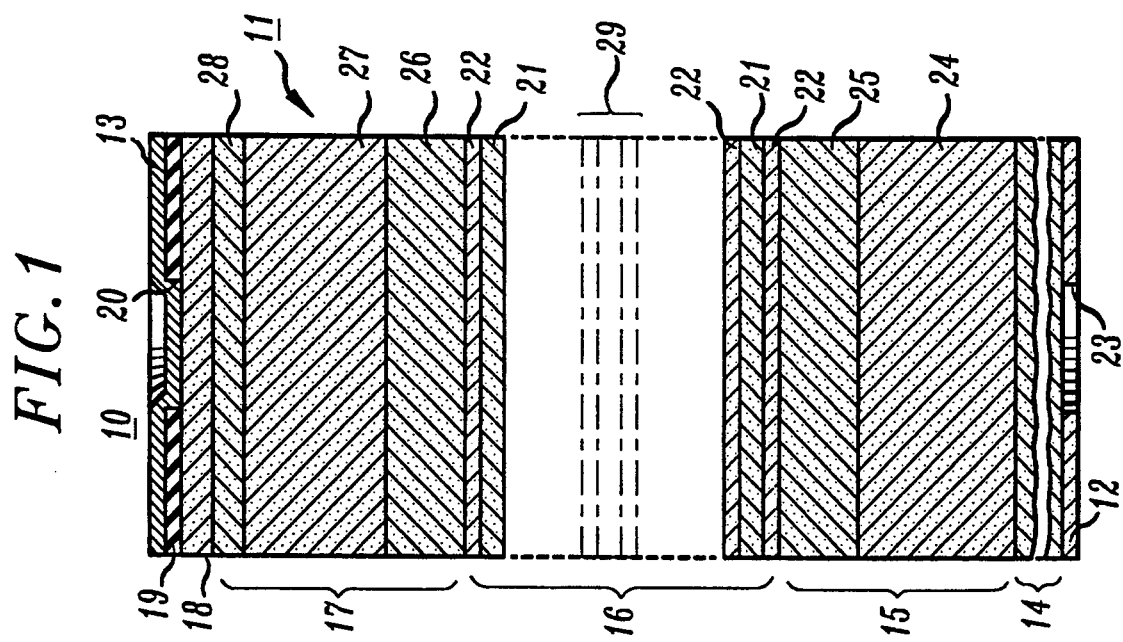
FIG. 1 is a schematic representation of a structure for a multiple quantum well LED with a metallic mirror.
Figure 2:
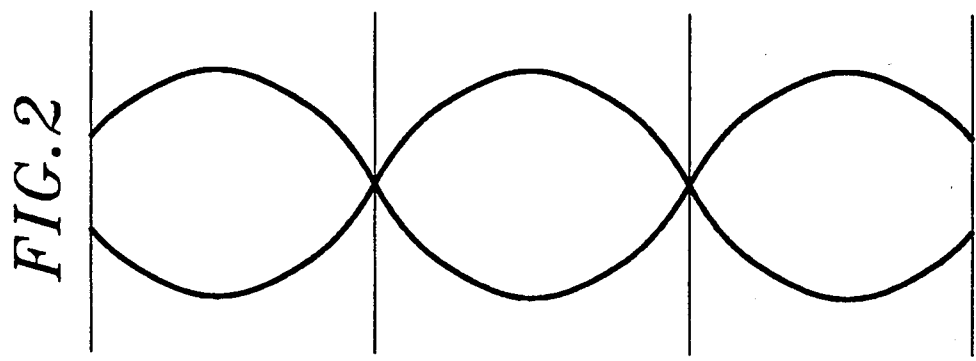
FIG. 2 is a plot of a normal incidence optical mode for the device shown in FIG. 1.
Figure 3:
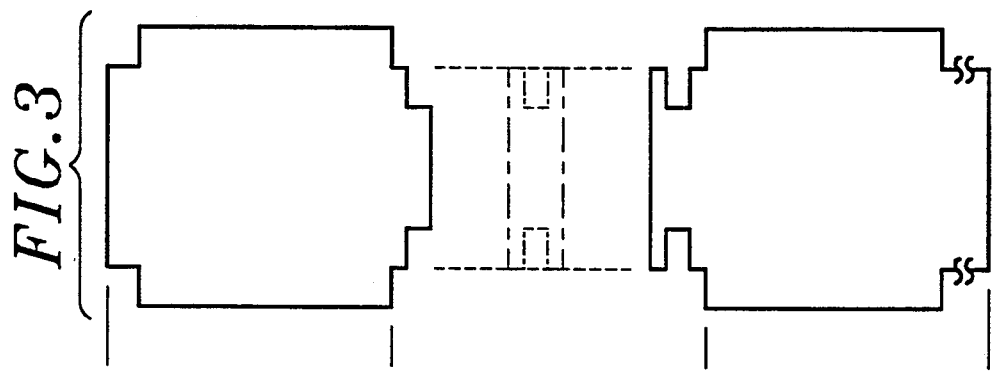
FIG. 3 is a plot of conductor and valence bands for the device shown in FIG. 1.

In FIGS. 1, 2 and 3 are shown, respectively, the schematic structure for a multi-quantum well LED, the optical mode of the device, and the schematic representation of conduction and valence bands of the device. Also shown, in phantom, in FIG. 1 is a schematic position of a single quantum well and in FIG. 3 a schematic position of conduction and valence bands for the single quantum well. For illustration purposes, various dimensions of the drawings are drawn not to scale.

In FIG. 1 is shown a schematic representation of an LED, designated generally as 10, embodying the invention. LED 10 includes a semiconductor structure, designated generally as 11, and a bottom electrode, 12, and a top electrode, 13, to the structure. The semiconductor materials of the semiconductor structure are Group III-V or II-IV semiconductors such as GaAs, AlGaAs, GaInAs, AlGaInAs, InP, GaInP, GaInPAs and other group III-V and II-VI compound semiconductors lattice matched to GaAs and/or to InP. Structure 11 includes, in an ascending order from bottom electrode 12, a substrate, 14, a bottom confining region, 15, an active region, 16, a top confining region, 17, and a contact layer, 18. An insulating layer, 19, with a window, 20, is between the contact layer and top electrode 13.

A more detailed construction of LED 10 is as follows:

Substrate 14 is a heavily doped III-V or II-VI semiconductor. Typically, the thickness of the substrate ranges from 50 to 650 $\mu$m, and the doping concentration ranges from $1 \times 10^{17}$ to $4 \times 10^{18}$ cm$^{-3}$.

Confining regions 15 and 17 are provided to confine active region 16. The thicknesses of these regions range from 0 to 2 $\mu$m.

Active region 16 is a multiquantum well (MQW) structure including from two to 10 quantum wells. Each quantum well includes a narrow-gap semiconductor 21 from 1 to 30 nm thick clad by wide-gap semiconductors, 22, from 1 to 20 nm thick each.

Contact layer 18 is a highly doped layer from 0.01 to 0.1 $\mu$m thick and with doping concentration ranging from $1 \times 10^{19}$ to $1 \times 10^{20}$ cm$^{-3}$, preferably about $5 \times 10^{19}$ cm$^{-3}$. The contact layer is provided to facilitate establishment of a non-alloyed ohmic contact between top electrode 13 and the semiconductor structure.

A thin layer 19 of dielectric material, such as SiO$_2$, Si$_3$N$_4$, borosilicate glass such as Vicor ®, etc. is formed on top of contact layer 18 in a thickness of from 0.01 to 0.1 $\mu$m. Layer 19, which acts as a barrier between contact layer 18 and top electrode 12, has a centrally located window 20 permitting direct contact between top electrode 13 and contact layer 18.

Top electrode 13 is selected from metals which are electrically conducting, have low resistivity and are highly reflective, with reflectivity ranging between 90 percent and 99 percent and higher. Metals may be selected from Ag, Au, AuBe, AuZn, Cr, and Ti. Provision of window 20 in layer 19 enables passage of operating current from top electrode 13 to bottom electrode 12 through a narrow passage defined by the window. The top electrode is from 30 to 5,000 nm thick.

Bottom electrode 12, ranging from 0.1 to 10 μm in thickness is formed on the bottom surface of substrate 14 to provide for current flow through the active region. The bottom electrode is of a metal which forms an ohmic contact substrate of the semiconductor structure. Gold, indium and their alloys, such as AuGe, AuSn and InSn, are suitable metals for the bottom electrode. A window, 23, is provided in the bottom electrode to permit passage of spontaneous emission from the active region.

Layers of the semiconductor structure are grown upon substrate 14 by such known methods as metal organic vapor phase epitaxy (MOVPE) or molecular beam epitaxy (MBE) or hydride vapor phase epitaxy (VPE) which are well known. Top metal electrode may be deposited by evaporation at temperatures of semiconductor structure ranging from 20° to 150° C., or by sputtering, or by electron-beam deposition.

Active region 16 is positioned relative to the optical mode of the device so that each of the quantum wells of the active region is positioned in an optical anti-node of the device. The optical anti-node may be any one of anti-nodes relative to the top electrode. Preferably, the anti-node second from the top is used for this purpose. The number of quantum wells in the active region is selected to provide an optimum output intensity from the device.

In the exemplary embodiment, the LED is an $Al_xGa_{1-x}As/GaAs/In_yGa_{1-y}As$ structure, with x ranging from 0.1 to 0.4, and y ranging from 0.05 to 0.25. In the preferred embodiment, the LED comprises, in an ascending sequence, 0.1 to 2 μm thick AuGe electrode 12; 500 μm thick (001)-oriented n+-doped ($2 \times 10^{18}$ cm$^{-3}$) GaAs substrate 14; bottom confining region 15 including an n-doped ($3 \times 10^{17}$ cm$^{-3}$) $Al_{0.2}Ga_{0.8}As$ layer, 24, and a 40 nm thick undoped (intrinsic) $Al_{0.2}Ga_{0.8}As$ layer, 25; and active region 16 including a plurality of 5.6 nm thick undoped GaAs cladding layers, 22, and a plurality of 10 nm thick undoped $In_{0.16}Ga_{0.84}As$ active layers 21 with each active layer being clad by two cladding layers. The LED structure further includes top confining region 17 including a 40 nm thick undoped $Al_{0.2}Ga_{0.8}As$ layer, 26, a p-type doped ($3 \times 10^{17}$ cm$^{-3}$) $Al_{0.2}Ga_{0.8}As$ layer, 27, and a 15 nm thick p+-type doped ($1 \times 10^{19}$ cm$^{-3}$) GaAs layer, 28; 15 nm thick p+-type doped ($1 \times 10^{19}$ cm$^{-3}$)GaAs contact layer 18; 120 nm thick $SiO_2$ layer 19, with 10 μm diameter window 20; and silver top electrode 13. Depending on the number of quantum wells in the active region, the thickness of confining region layers 24 and and 27 will vary, respectively, from 153 nm and 101 nm for a single quantum well, to 83 and 31 for ten quantum wells. Alternatively, layers 25 and/or 26 and 28 may be varied in thickness in conjunction with the variation in thickness of layers 24 and/or 27. The thickness variation is needed to place the quantum wells into an anti-node of the optical mode of the LED.

In order to determine the power, efficiency, and spectral characteristics of multi-quantum well LEDs, applicants have fabricated devices with from two to ten multi-quantum wells. These structures were grown by molecular beam epitaxy with 10 nm thick $In_{0.16}Ga_{0.84}As$ wells, 21, and 5.6 nm thick GaAs barrier or cladding layers, 22. For comparison, LEDs with a single quantum well centered in the anti-node of the optical mode of the LED were fabricated in the same manner as the multi-quantum well LEDs. A single quantum well, 29, and its band diagram representation are shown in phantom in FIGS. 1 and 3. In the LED with multi-quantum wells, the confining regions, and especially top confining region 17, are made thinner as the number of wells increases in order to position the active region at the optical anti-node. As more wells are added, they cannot all be positioned exactly at the anti-node, reducing the theoretical intensity enhancement achievable with the single mirror structure. The size of the anti-node is equal to λ/2 where λ is the wavelength of light in the emitting (active) region, and the position, P, of the center of the anti-node may be calculated as follows:

$$P = (2m\pi - \theta_R)\frac{\lambda}{4\pi}$$

wherein m is an integer, and $\theta_R$ is the phase change on reflection from the metal mirror, and $0 \leq \theta_R < 2\pi$. Therefore, the center of each anti-node relative to the metal mirror may be found at every λ/2. For example, $\theta_R$ for silver is ≈4.0. In this specific example, for an LED with GaAs substrate, $Al_{0.2}Ga_{0.8}As$ confining regions, $In_{0.16}Ga_{0.04}As$ wells, GaAs cladding layers, and silver mirror-electrode, the second anti-node shall have the length (size) of 138 nm and the center of the second anti-node shall be located 182 nm below the mirror.

For a device with one quantum well, the theoretical intensity enhancement is about 3.8. For four, six, and eight quantum wells, the theoretical intensity enhancements are 3.4, 2.8, and 2.2, respectively. For the eight well structure, the active region is approaching a thickness of λ/2 whereby the maximum enhancement is 2.0. The enhancement for greater thicknesses than this is just under or over 2, depending on positioning.

The enhancement process can be explained by constructive interference of the direct and reflected beams in the normal direction, giving for the maximum enhancement a formula of $(1+\sqrt{R})^2$, wherein R is the reflectance of the mirror. For a reflectance R=0.96, ignoring substrate-to-air reflections, the anti-node placement of the single quantum well enhances the normal emission intensity through the substrate by a factor of 3.85. Because the metal mirror is in close proximity to the quantum well, the anti-node position would change slowly with wavelength, ensuring that the enhancement is mostly preserved over the entire spectral range of the LED.

Figure 4:
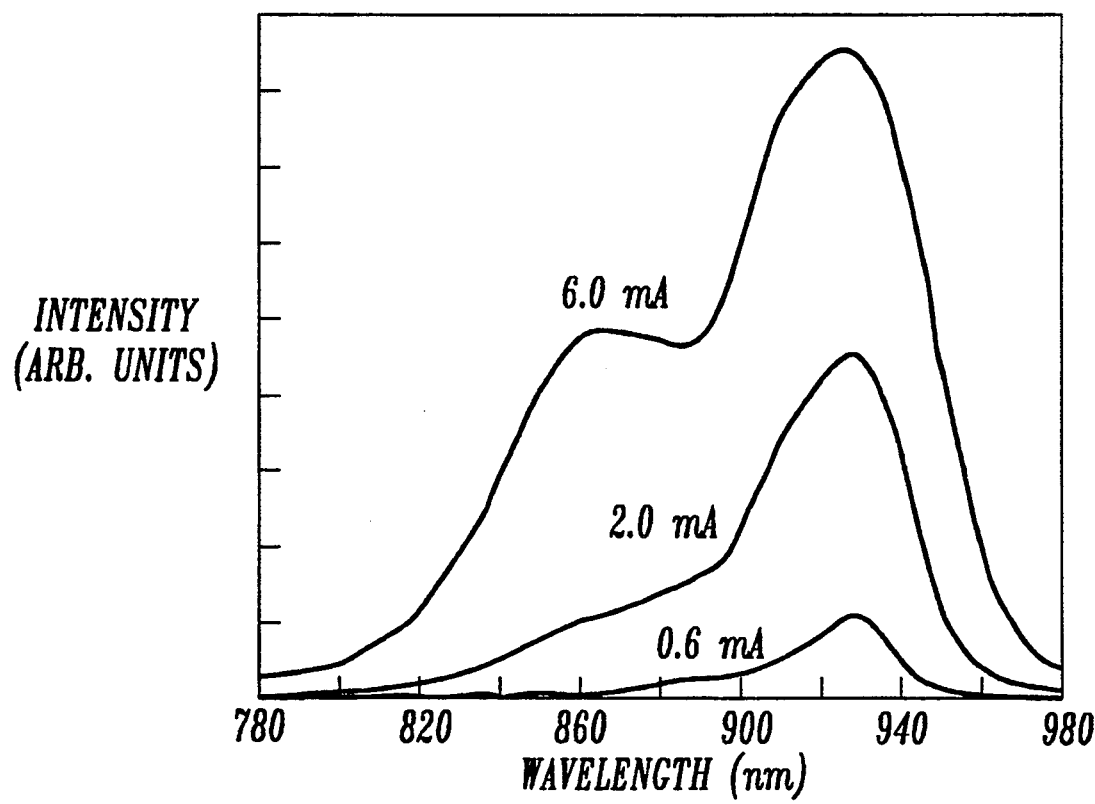
FIG. 4 is a plot of 295K spectra through the top of a single quantum well device with a semitransparent silver top mirror, showing the effects of band filling.

The maximum usable current at which an LED can operate is determined by a number of factors including the effects of band filling. In FIG. 4 is shown the emission spectra from the top of a device of a general construction shown in FIG. 1, but with only one quantum well 29 and with a thin, 30 nm thick, semitransparent top silver mirror, which simultaneously acts as the top electrode of the device. The current is injected from a silver electrode with a ten micrometer diameter contact to contact layer 18. The silver electrode simultaneously acts as a mirror with a 96 percent reflection characteristic. In order to be able to measure the spectrum and the degree of band filling at various voltage and power applications, this emission takes place through the top electrode of the device, rather than through the substrate. Such analysis would not be possible if emission would take place through the bottom, because of absorption of light by the substrate.

The amplitudes of the normal incidence optical mode with the active quantum well in the anti-node are shown in FIG. 4. The emission is narrow at an injection current of 0.6 mA, but begins to broaden by 2 mA, and is very broad by 6 mA. This indicates very high carrier concentrations, and the broad spectra would result in a large amount of chromatic dispersion in an optical fiber. Clearly, a single quantum well cannot be pumped very hard, and, therefore, cannot achieve high spontaneous output intensities. For a reasonable carder lifetime of 1 ns, a 1 mA pump current into a single well at a current density of 1.3 kA/cm$^{-2}$ would result in a carrier density of $8 \times 10^{12}$ cm$^{-2}$ or about $8 \times 10^{18}$ cm$^{-3}$. At such injection currents, it is expected for band filling to occur. The band filling associated with high carder densities results in higher chromatic dispersion in optical fibers, limiting communication bandwidth and distance.

Figure 5:
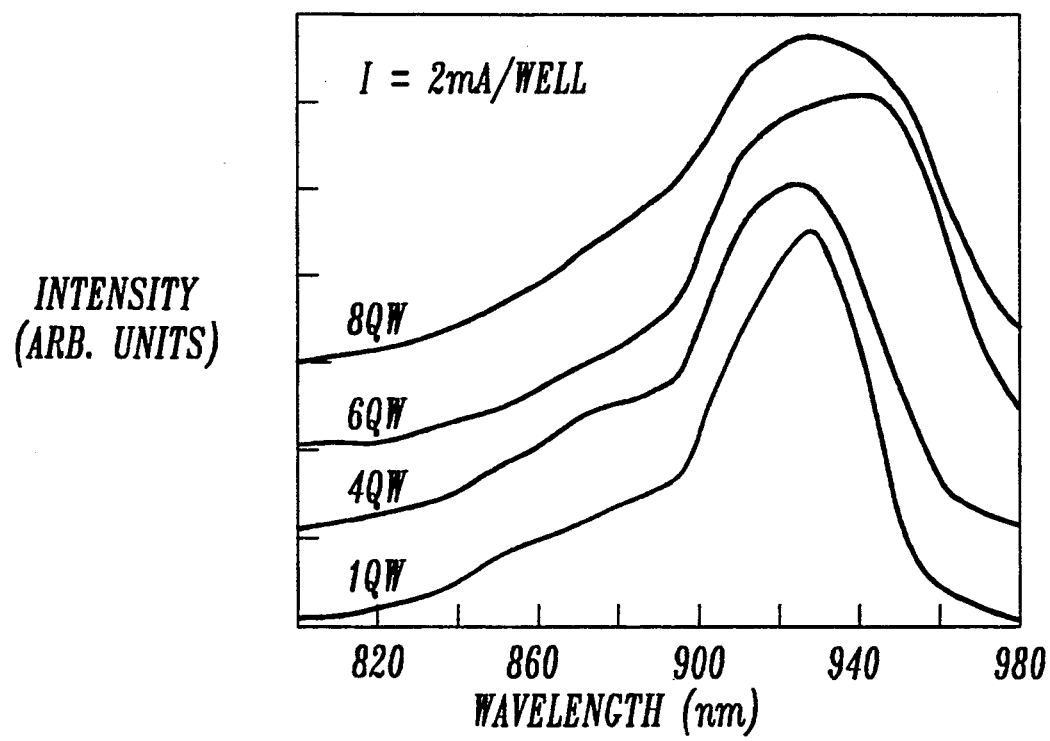
FIG. 5 is a plot of spectra through the top of a semi-transparent silver mirror for 1, 4, 6 and 8 quantum well samples for 2, 8, 12 and 16 mA pump currents, respectively.

In FIG. 5 is shown the top emission spectra through the 30 nm thick 10 $\mu$m in diameter silver mirror for four, six and eight quantum wells at an injection current of 2.0 mA per well. Also shown, for comparison, is the emission spectra for one quantum well at the same injection current. This should result in similar carrier densities in the wells and therefore similar spectra. It is clear from the curves, and by comparison with FIG. 4 that the carrier densities must indeed be similar. This shows that placing more wells within the anti-node of the optical mode is advantageous to achieving high output powers.

Figure 6:
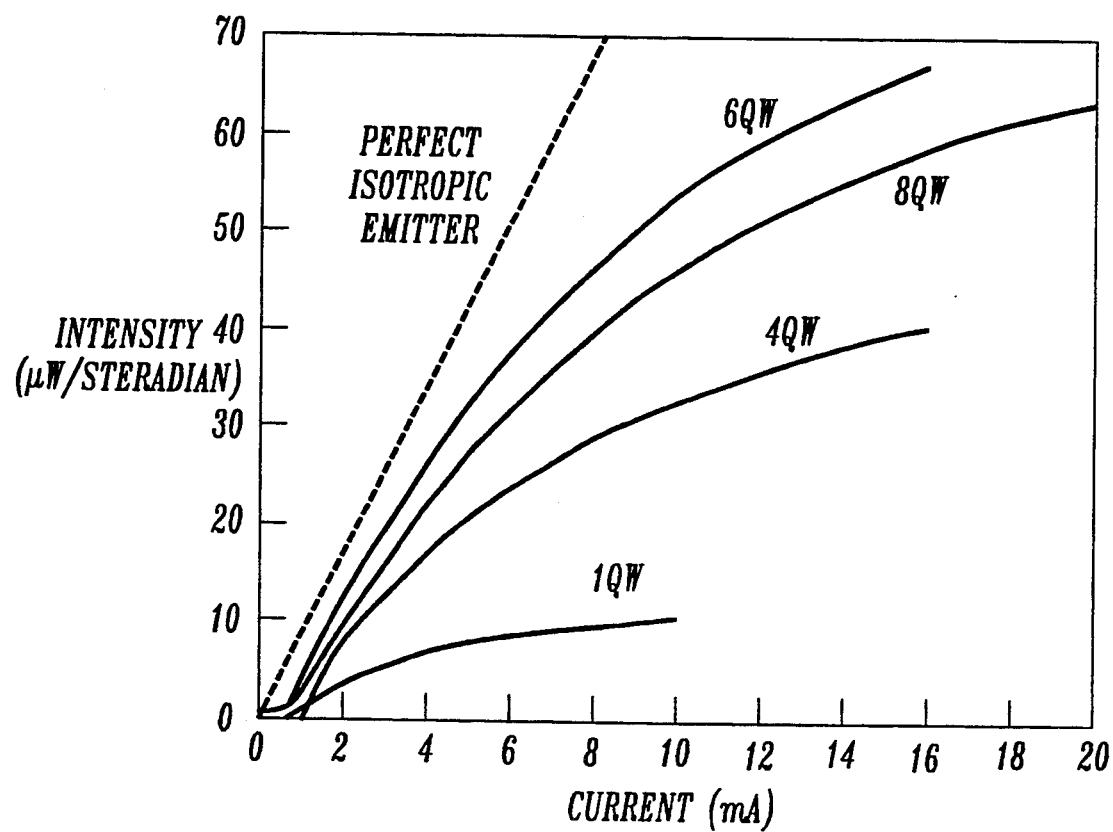
FIG. 6 is a plot representing the intensity of emission in a narrow solid angle versus pump current for 1, 4, 6 and 8 quantum-well samples and the line (dashed) representing a perfect efficiency LED without mirror and with an isotropically emitting active region.

The light output from the substrate of the LED versus current was measured for the devices with four, six and eight quantum wells and, for comparison, with one quantum well. The results of these measurements are shown in FIG. 6 at normal incidence. The light versus current curves for the multiple quantum well samples exhibit less current saturation than for the single quantum well sample and achieve intensity levels that are useful for communications. The spectrally integrated intensity was measured with a calibrated small area detector placed 7.5 cm away from the devices. Subsequently the intensity per steradian was calculated. While the intensity drops with angle from the normal, the normal incidence value is the most important since, even when using lenses for coupling LEDs and fibers, only a small solid angle of the LED emission is coupled into a fiber. How much light is coupled into a fiber depends on the geometry of the coupling optics, and the thickness of the substrate. The straight dashed line corresponds to the calculated light intensity for a 100 percent internal quantum efficiency isotropic emitter with an ideal R=0 antireflection coating. This efficiency cannot be achieved in conventional LEDs with a non-unity internal quantum efficiency. However, devices embodying this invention approach this efficiency, even without the use of antireflection coatings. Initially, efficiencies are similar to that of a perfect isotropic emitter, or 8.7 $\mu$W/steradian/mA in air at normal incidence from a material with refractive index n=3.5 at a wavelength $\lambda_0 = 0.93$ $\mu$m. This efficiency is given by $[(1240/\lambda_0)(1/(4\pi n^2)]$. Considering the theoretical enhancement factors of up to 4, it is possible for future devices to perform even better. The optical coupling with the mirror is not expected to significantly affect device speed, since the Einstein spontaneous emission factor $A_{sp}$ will be increased by less than five percent, only. An initial kink in the curves is caused by a small leakage current of 300 $\mu$A to 600 $\mu$A.

As is schematically represented in FIG. 6, intensities of emission approaching that of a perfect isotropic emitter can be obtained in a multi-quantum well, single-mirror LED by placing as many multi-quantum wells of the active region in the anti-node of the optical mode as possible. The highest efficiency was observed from a 6 quantum well sample, which has a theoretical enhancement of 2.8 at this wavelength. Larger diameter devices would give similar efficiencies, with higher final power at proportionally higher current.

The one quantum well sample has a lower initial efficiency than the other samples, probably because of reduced capture of the carriers in the quantum well. It is clear, however, that its light output saturates at a low pump current. This saturation is caused partly by the combination of band filling and the effect of the GaAs substrate absorption of light with wavelength shorter than 890 nm. With this degree of band-filling, however, it is clear that one cannot pump the single quantum well at high currents.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. A light-emitting diode (LED) which comprises a semiconductor structure including an active region, and a top electrode and a bottom electrode to the structure, wherein said top electrode is a reflector and said bottom electrode has a window for passage of light emission of the device, said top electrode sets up a standing optical wave for light emitted through said window, said active region comprises a plurality of quantum wells positioned relative to the top electrode so that the center of the active region occurs at a distance from the top electrode which is greater than $\lambda/2$, wherein $\lambda$ is the emission wavelength of the semiconductor, said active region fits into an anti-node of an optical mode of the LED, and the center of said active region occurs at a position of at leat a second anti-note of the standing optical wave.

2. The LED of claim 1, in which said plurality of quantum wells includes us to ten quantum wells.

3. The LED of claim 1, in which said plurality of quantum wells includes six quantum wells.

4. The LED of claim 1 in which said structure comprises in an ascending order from the bottom electrode: a substrate, a bottom confining region, an active region, a top confining region and a contact layer.

5. The LED of claim 4, in which a dielectric barrier layer is on the contact layer, the barrier layer having a window exposing an area of the contact layer, said top electrode being in contact with the barrier layer and, through said window, with the contact layer.

6. The LED of claim 4, in which said semiconductor structure is an $Al_xGa_{1-x}As/GaAs/In_yGa_{1-y}As$ system, with x ranging from 0.1 to 0.4, and y ranging from 0.05 to 0.25.

7. The LED of claim 6, in which said active region comprises $In_yGa_{1-y}As$ quantum wells clad by GaAs.

8. The LED of claim 7, in which said x is equal to 0.2 and y is 0.16.

9. The LED of claim 1, in which said top electrode comprises a metal selected from the group consisting of Ag, Au, AuBe, AuZn, Cr and Ti.

10. A light emitting diode (LED) which comprises a semiconductor structure comprising Group III–V semiconductors and a top and a bottom electrode to the structure.

said structure comprising, in an ascending order from the bottom electrode, a substrate, a bottom confining region, an active region, a top confining region, and a contact layer, a dielectric barrier layer on top of the contact layer has a window exposing a small area of the contact layer, said top electrode being in contact with said dielectric barrier layer and, through said window, with the contact layer.

said top electrode is a reflector and said bottom electrode has a window for passage of light emission of the device, said top electrode sets up a standing optical wave for light emitted through said window, wherein said active region comprises a plurality of quantum wells positioned relative to the top electrode so that the center of the active region occurs at a distance from the top electrode which is greater than $\lambda/2$, wherein $\lambda$ is the emission wavelength of the semiconductor, said active region fits into an anti-node of an optical mode of the LED, and the center of the active region occurs at a position of at least a second anti-node of the standing optical wave.

11. The LED of claim 10, in which said plurality of quantum wells includes us to ten quantum wells.

12. The LED of claim 10, in which said plurality of quantum wells includes six quantum wells.

13. The LED of claim 10, in which said semiconductor structure is an $Al_xGa_{1-x}As/GaAs/In_yGa_{1-y}As$ system, with x ranging from 0.1 to 0.4, and y ranging from 0.05 to 0.25.

14. The LED of claim 13, in which said active region comprises $In_yGa_{1-y}As$ quantum wells clad by GaAs.

15. The LED of claim 14, in which said x is equal to 0.2 and y is 0.16.

16. The LED of claim 10, in which said top electrode comprises a metal selected from the group consisting of Ag, Au, AuBe, AuZn, Cr and Ti.

* * * * *